(12) United States Patent
Kula

(10) Patent No.: US 6,893,978 B1
(45) Date of Patent: May 17, 2005

(54) METHOD FOR OXIDIZING A METAL LAYER

(75) Inventor: Witold Kula, Cupertino, CA (US)

(73) Assignee: Silicon Magnetic Systems, San Jose, CA (US)

(*) Notice: Subject to any disclaimer, the term of this patent is extended or adjusted under 35 U.S.C. 154(b) by 0 days.

(21) Appl. No.: 10/309,380

(22) Filed: Dec. 3, 2002

(51) Int. Cl.$^7$ ............................ H01L 21/31; H01L 21/26
(52) U.S. Cl. ................... 438/765; 438/635; 438/768; 438/798
(58) Field of Search ................... 438/768, 635, 438/659, 764, 765, 766, 788, 798

(56) References Cited

U.S. PATENT DOCUMENTS

| | | | | |
|---|---|---|---|---|
| 4,900,695 A | * | 2/1990 | Takahashi et al. | 438/625 |
| 5,248,632 A | * | 9/1993 | Tung et al. | 438/600 |
| 5,273,937 A | * | 12/1993 | Nishihori et al. | 438/181 |
| 5,700,613 A | * | 12/1997 | Nogami et al. | 430/59.5 |
| 5,733,821 A | * | 3/1998 | Nishikawa | 438/727 |
| 5,849,611 A | * | 12/1998 | Yamazaki et al. | 438/151 |
| 6,006,763 A | * | 12/1999 | Mori et al. | 134/1.1 |
| 6,207,536 B1 | * | 3/2001 | Matsumoto et al. | 438/478 |
| 6,245,396 B1 | | 6/2001 | Nogami | |
| 6,352,050 B2 | | 3/2002 | Kamarehi et al. | |
| 6,391,727 B1 | * | 5/2002 | Park | 438/287 |
| 6,417,537 B1 | * | 7/2002 | Yang et al. | 257/310 |
| 6,427,623 B2 | | 8/2002 | Ko | |
| 6,436,487 B1 | | 8/2002 | Ikemoto et al. | |
| 6,450,116 B1 | | 9/2002 | Noble et al. | |
| 6,452,315 B1 | * | 9/2002 | Vane | 313/231.31 |
| 6,458,695 B1 | * | 10/2002 | Lin et al. | 438/659 |
| 6,541,397 B1 | * | 4/2003 | Bencher | 438/780 |
| 6,544,886 B2 | * | 4/2003 | Lu et al. | 438/637 |
| 6,573,607 B2 | * | 6/2003 | Ito et al. | 257/762 |
| 6,610,257 B2 | * | 8/2003 | Vane | 422/186.04 |
| 6,638,862 B2 | * | 10/2003 | Sneh | 438/685 |
| 6,667,475 B1 | * | 12/2003 | Parran et al. | 250/306 |
| 6,727,569 B1 | * | 4/2004 | Gardner et al. | 257/513 |
| 6,752,869 B2 | * | 6/2004 | Lee et al. | 117/104 |
| 6,806,183 B2 | * | 10/2004 | Kang et al. | 438/627 |
| 2001/0002280 A1 | * | 5/2001 | Sneh | 427/255.28 |
| 2002/0172768 A1 | * | 11/2002 | Endo et al. | 427/255.28 |
| 2003/0025146 A1 | * | 2/2003 | Narwankar et al. | 257/310 |
| 2003/0040196 A1 | * | 2/2003 | Lim et al. | 438/785 |
| 2003/0096468 A1 | * | 5/2003 | Soininen et al. | 438/200 |

OTHER PUBLICATIONS

Xu et al., "Plasma Damage Free SiO$_2$ Deposition for low Temperature Poly–Si AMLCD," 4 pages.

* cited by examiner

Primary Examiner—Matthew Smith
Assistant Examiner—Lex H. Malsawma
(74) Attorney, Agent, or Firm—Kevin L. Daffer; Mollie F. Lettang; Daffer McDaniel L.L.P.

(57) ABSTRACT

A method for oxidizing a semiconductor topography is provided, which includes generating a plasma from a first gas comprising oxygen and a second gas adapted to enhance the generation of oxygen radicals from the first gas. In addition, the method includes extracting the oxygen radicals from the plasma and diffusing the oxygen radicals into one or more layers of the topography. In general, the second gas may include any gas having a component adapted to enhance the generation of oxygen radicals from the first gas. For example, in some embodiments, the second gas may include a gas including nitrogen. In such an embodiment, the ratio of the first gas to the second gas may be adapted to prevent the introduction of nitrogen within the oxidized topography. In addition or alternatively, such a method may include oxidizing a portion of a layer which has a thickness greater than approximately 6 angstroms.

18 Claims, 2 Drawing Sheets

METHOD FOR OXIDIZING A METAL LAYER

BACKGROUND OF THE INVENTION

1. Field of the Invention

This invention relates to semiconductor processing and, more particularly, to a method for oxidizing one or more layers within a semiconductor topography.

2. Description of the Related Art

The following descriptions and examples are given as background information only.

Oxidation is a common technique used in semiconductor fabrication processing for forming a dielectric layer. More specifically, the diffusion of oxygen into a material is often used to form a dielectric within a semiconductor topography. For example, oxygen molecules may be diffused into silicon to produce silicon dioxide. In other cases, oxygen may be diffused into silicon nitride to produce silicon oxynitride. In yet other embodiments, oxygen may be diffused into metal such that a metal oxide may be formed. In any case, dielectric layers play a vital role within semiconductor devices. In particular, dielectric layers often serve to isolate metal layers. In some cases, dielectrics may additionally serve as a barrier layer to the diffusion of impurities from underlying or overlying layers. In yet other embodiments, a dielectric layer may serve as a tunneling layer for electrons. For example, a dielectric may be used within magnetic tunnel junctions (MTJ) of magnetic random access memory (MRAM) circuits such that tunnel magnetoresistance may be used to measure a differential resistance between magnetic states of the junction.

Consequently, in some cases, the compositional and/or dimensional characteristics of dielectric layers may directly affect the operation of devices formed from such layers. For example, the thickness of a dielectric may affect the insulating properties of the layer since the insulating properties of a given dielectric material generally increase with the thickness of a layer. In the case of a MTJ, the tunneling resistance of a junction is generally exponentially dependent on the thickness of the dielectric tunneling layer. As such, it is typically advantageous to fabricate the dielectric tunneling layer of a MTJ at a particular thickness such that an optimum tunneling magnetoresistance ratio may be obtained within the junction. In addition, the distribution of oxygen molecules within a layer may affect the insulating and tunneling properties of a dielectric layer. More specifically, non-uniformity of the placement of oxygen molecules along the lateral and vertical dimensions of the layer may cause the properties of the dielectric layer to be inhomogeneous.

Unfortunately, however, not all oxidation processes are able to produce dielectric layers with uniform distributions of oxygen. In addition, some oxidation processes are limited in the thickness of dielectric that may be generated from their processes. For example, the process commonly referred to as "natural oxidation" typically cannot oxidize more than a few angstroms of a particular material. For instance, natural oxidation typically cannot oxidize more than approximately 6 angstroms of aluminum metal. Similar thickness limitations generally exist for other materials oxidized by natural oxidation as well. In general, the process of natural oxidation causes the surface of a material to quickly passivate. Such surface passivation prevents oxygen molecules from diffusing further into the material, restricting the thickness of the resulting dielectric.

As such, in some cases, the process of natural oxidation may not produce a dielectric which provides adequate insulation, barrier, or tunneling properties for the device being fabricated. For example, in some embodiments, the thickness of an aluminum oxide tunneling layer of a MTJ may need to be approximately 15 angstroms in order to obtain adequate tunneling resistance through the junction. The aluminum layer used to fabricate a tunneling layer of such thickness may need to be approximately 10 angstroms thick prior to oxidation. Consequently, natural oxidation may not provide an aluminum oxide layer of sufficient thickness in such a case. In some embodiments, the natural oxidation process may be duplicated in order to oxidize an accumulative amount of aluminum that is approximately 10 angstroms thick. Such a process may be difficult to fabricate, however, due to the difficulty of depositing metal layers with uniform thicknesses of less than approximately 10 angstroms. In addition, such a process is undesirably long, increasing the processing time and, therefore, the costs of the fabrication process. In any case, a MTJ having an aluminum oxide layer produced from natural oxidation generally has a relatively low junction resistance. Consequently, the differential output voltage signal from such a junction may be undesirably low, reducing the probability of reading correct information from the device.

In addition, natural oxidation is often conducted at temperatures greater than approximately 300° C. in order to oxidize a layer with a targeted thickness and/or within a targeted time frame. For example, in some cases, the oxidation processes may be conducted between approximately 400° C. and approximately 1100° C. In some embodiments, exposure to such temperatures may undesirably affect the operation of a device. For example, a device having magnetic layers may be affected by a processing temperature greater than approximately 400° C. or, more specifically, greater than approximately 300° C., in some cases. In particular, a relatively high temperature may alter the magnetic direction or the strength of magnetization within magnetic layers of a device. In some embodiments, such a high processing temperature may cause individual magnetic layers within a structure to interdiffuse, causing the properties of the magnetic layers to change.

A method often used to oxidize relatively thick layers of metal in a timely manner and at a relatively low temperature is a process referred to as "plasma oxidation." In general, plasma oxidation may refer to a process which generates a plasma comprising oxygen and directs ions from the plasma toward the surface of the layer being oxidized. The process is conducted within a single chamber reaction vessel and, therefore, is sometimes referred to as "direct plasma oxidation." The diffusion of ions within a layer, however, may undesirably rearrange the atomic structure of the layer being oxidized. In particular, the diffusion of ions may cause the electrical and structural properties of a layer to change beyond what may be obtained through natural oxidation of such a layer. In addition, such a process may produce a dielectric with a non-uniform distribution of oxygen within the layer, causing inhomogeneous insulation, barrier, and/or tunneling properties. Furthermore, oxygen in such a process may, in some embodiments, diffuse to underlying layers before fully oxidizing the surface layer. Such a characteristic may be particularly undesirable for the fabrication of a tunneling layer of a MTJ. In particular, oxidizing a magnetic layer underlying a tunneling layer of a MTJ may reduce the magnetoresistance of the MTJ during operation of the MRAM circuit.

Therefore, it may be advantageous to develop a method which can efficiently oxidize a relatively thick layer of material without causing the problems described above. In particular, it may be beneficial to develop a method which can oxidize a layer at a temperature less than approximately 300° C. In addition, it may be advantageous to develop a method which can oxidize a portion of a layer having a thickness greater than approximately 6 angstroms without oxidizing underlying layers. Such a method may also be capable of oxidizing a portion of a layer having a thickness less than approximately 6 angstroms as well. In either case, it would be beneficial for such a method to produce an oxidized topography having a uniform distribution of oxygen such that a dielectric layer having homogeneous properties may be fabricated. Furthermore, it would be advantageous for such an oxidation method to diffuse oxygen into a layer without undesirably rearranging the layer's atomic structure beyond what may be obtained through natural oxidation of such a layer.

SUMMARY OF THE INVENTION

The problems outlined above may be in large part addressed by an oxidation method, which includes generating a plasma from a first gas comprising oxygen and a second gas adapted to enhance the generation of oxygen radicals from the first gas. In general, the second gas may include any gas which has a component adapted to enhance the generation of oxygen radicals from the first gas. For example, in some embodiments, the second gas may include a gas including nitrogen. More specifically, the second gas may include diatomic nitrogen gas or ammonia, in some cases. In yet other embodiments, the second gas may include a gas comprising a component other than nitrogen which is adapted to enhance the generation of oxygen radicals from the first gas. In either case, the second gas may be further adapted to contribute additional oxygen radicals to the plasma, in some embodiments. For example, in some cases, the second gas may include a gas comprising nitrogen and oxygen, such as nitrous oxide. In general, several other gases may be additionally or alternatively used for the generation of a plasma within the method described herein. As such, in some embodiments, the method may include generating a plasma from a plurality of gases which are adapted to enhance the generation of oxygen radicals from the first gas.

In any case, the method described herein may be used for the fabrication of oxidized layers within any semiconductor device. For example, the method described herein may used for the fabrication of a tunneling layer of a magnetic tunnel junction, in some embodiments. Alternatively, the method may be used for the fabrication of oxidized layers in other semiconductor devices. In either case, the layer to be oxidized, in some embodiments, may include a metal, such as but not limited to aluminum, copper, hafnium, iron, magnesium, titanium, tungsten, zirconium, cobalt-iron, nickel-iron, nickel-iron-cobalt alloys, cobalt-zirconium-niobium, cobalt-iron-boron, platinum-manganese, nickel-manganese, osmium-manganese, platinum-palladium-manganese, platinum-manganese-chromium, and any alloys of such materials, for example. In yet other embodiments, the layer to be oxidized may include silicon, such as a monocrystalline silicon substrate, for example. In either case, the method described herein may further include extracting oxygen radicals from the plasma and diffusing such oxygen radicals into a layer of a semiconductor topography such that the layer is oxidized.

In general, the method may be adapted to fabricate an oxidized portion of the layer with any thickness. For example, in some cases, the method may be adapted to oxidize a portion of the layer having a thickness greater than approximately 6 angstroms. In particular, the method may be specifically adapted to oxidize a portion of the layer having a thickness between approximately 8 angstroms and approximately 11 angstroms. Alternatively, the method may be adapted to oxidize a portion of a layer having a thickness less than approximately 6 angstroms. In any case, the method may be adapted to prevent the oxidation of layers underlying the layer to be oxidized. Such adaptations of the method may include conducting the oxidation process within a remote plasma reaction chamber. More specifically, the method may include generating a plasma in one section of a chamber and diffusing the oxygen radicals from the plasma into a layer arranged within a different section of the chamber. In addition, the method may be conducted at a temperature less than approximately 300° C. For example, in some cases, the method may be conducted at a temperature between approximately 10° C. and approximately 250° C., or more particularly, between approximately 15° C. and approximately 30° C.

In some embodiments, the method may be adapted to prevent the introduction of nitrogen within the layer to be oxidized, such that an oxidized layer substantially absent of nitrogen may be fabricated. In particular, the ratio of the first gas to the second gas may be adapted to prevent the introduction of nitrogen within the oxidized layer. More specifically, the ratio of the first gas and the second gas may be adapted to create a plasma having a nitrogen to oxygen ratio which does not allow nitrogen to diffuse into the layer to be oxidized. For example, in some embodiments, the first and second gases may be combined to create a plasma having a nitrogen to oxygen ratio between approximately 0.00002 and approximately 0.3. In some cases, such a nitrogen to oxygen ratio may be between approximately 0.0005 and approximately 0.1, or more specifically, between approximately 0.001 and approximately 0.005. Larger or smaller nitrogen to oxygen ratios, however, may be used, depending on the design specifications of the device and the parameters of the oxidation process.

There may be several advantages for using the method described herein. In particular, the method described herein may efficiently oxidize a portion of a layer having a thickness greater than approximately 6 angstroms without oxidizing underlying layers. Such a method may be particularly advantageous for the fabrication of a magnetic tunnel junction (MTJ) within an MRAM array. In particular, such a method may be used to form a metal oxide tunneling layer without oxidizing underlying magnetic layers of the junction. Similarly, the method may be used within a MRAM fabrication process to oxidize portions of magnetic layers such that at least a partial periphery of a MTJ may be outlined. In addition, the method described herein may be conducted at a temperature less than approximately 300° C., or more specifically at room temperature. Consequently, in a case in which the layer to be oxidized is contained within a semiconductor topography comprising magnetic materials, the process of oxidation may be conducted without undesirably affecting the properties of the magnetic materials. Furthermore, the method described herein may produce an oxidized layer having a uniform distribution of oxygen. In this manner, a dielectric layer having homogeneous properties may be fabricated. In particular, a dielectric layer having homogenous insulating, barrier, and/or tunneling properties may be fabricated. Furthermore, the method described herein may oxidize a layer without damaging the layer, or more specifically, without undesirably rearranging the layer's atomic structure beyond what may be obtained through natural oxidation of such a layer.

BRIEF DESCRIPTION OF THE DRAWINGS

Other objects and advantages of the invention will become apparent upon reading the following detailed description and upon reference to the accompanying drawings in which.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 1:
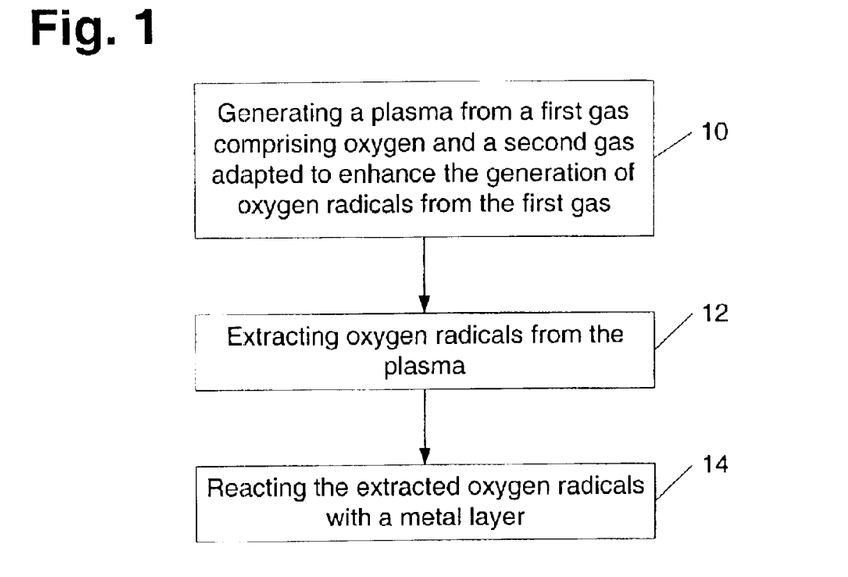
FIG. 1 depicts a flowchart outlining a method for oxidizing one or more layers of a semiconductor topography.

Turning to the drawings, the oxidation method described herein is outlined in the flowchart of FIG. 1. In particular, FIG. 1 includes step 10 which includes generating a plasma from a first gas comprising oxygen and a second gas adapted to enhance the generation of oxygen radicals from the first gas. In addition, the method includes step 12 in which the oxygen radicals are extracted from the plasma and step 14 in which the extracted oxygen radicals are diffused into a layer of a semiconductor topography. In general, such a method may be used for the fabrication of oxidized layers within any semiconductor device. For example, the method may be used for the fabrication of a tunneling layer of a magnetic tunnel junction, in some embodiments. Alternatively, the method may be used for the fabrication of oxidized layers in other semiconductor devices. In any case, the layer to be oxidized, in some embodiments, may include a metal, such as but not limited to aluminum, copper, hafnium, iron, magnesium, titanium, or tungsten, zirconium, cobalt-iron, nickel-iron, nickel-iron-cobalt alloys, cobalt-zirconium-niobium, cobalt-iron-boron, platinum-manganese, nickel-manganese, osmium-manganese, platinum-palladium-manganese, platinum-manganese-chromium, and any alloys of such materials, for example. In yet other embodiments, the layer to be oxidized may include silicon, such as a monocrystalline silicon substrate, for example.

Such a method is described in more detail below with regard to the operations of the remote plasma oxidation chamber illustrated in FIG. 2. As such, the method described herein, may include any of the limitations or adaptations described in reference to the operations of the remote plasma oxidation chamber illustrated in FIG. 2. "Remote plasma oxidation chamber," as used herein, may refer to any reaction chamber in which a plasma is generated in a first section of the chamber and the oxidation of a layer from such a plasma is conducted within a different section of the chamber. However, it is noted that the method described herein is not restricted to operations within remote plasma oxidation chambers alone. On the contrary, the method described herein may be used in any reaction chamber which is adapted to extract oxygen radicals from a plasma comprising oxygen radicals and oxygen ions. In particular, the method described herein may be used in any reaction chamber which is adapted to generate an atmosphere which is substantially absent of oxygen ions.

Figure 2:
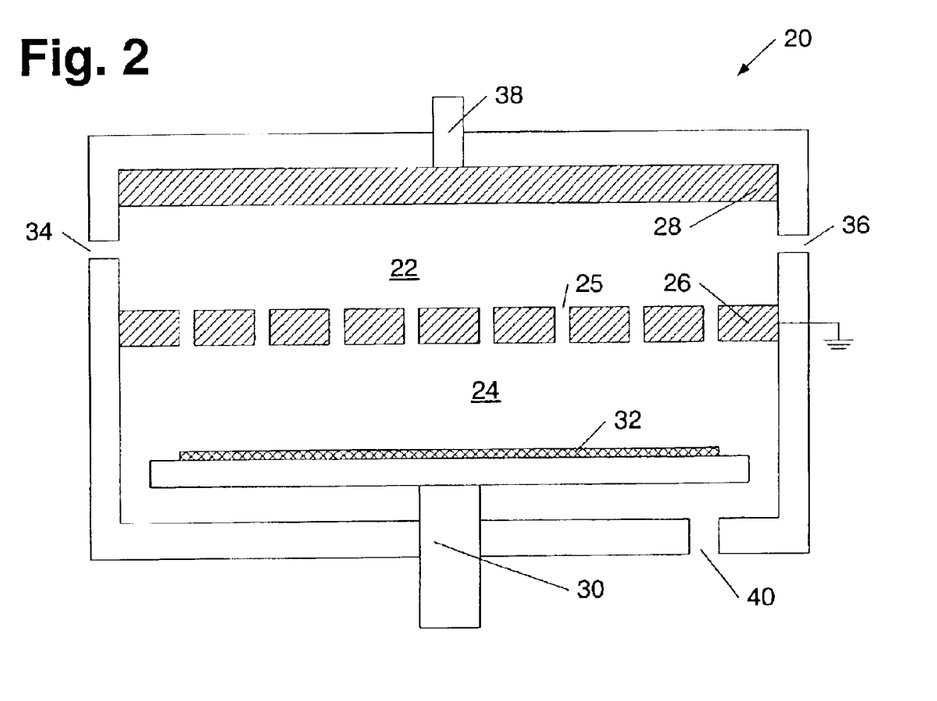
FIG. 2 depicts a partial cross-sectional view of an exemplary remote plasma reaction chamber.

FIG. 2 illustrates an exemplary cross-sectional view of a remote plasma oxidation chamber. In particular, FIG. 2 illustrates oxidation chamber 20 including plasma generation section 22 and oxidizing section 24 separated by partition 26. More specifically, oxidation chamber 20 includes plasma generation section 22 which may be defined as the area between electrode 28 and the upper surface of partition 26. Oxidizing section 24, on the other hand, may be the region of oxidation chamber 20 which is between the lower surface of partition 26 and the side of the oxidation chamber at which platen 30 is secured. In general, oxidizing section 24 may be the region of oxidation chamber 20 in which a layer of semiconductor topography 32 may be oxidized. In contrast, plasma generation section 22 may be the region of oxidation chamber 20 in which a plasma used for the oxidation of semiconductor topography 32 may be generated.

As shown in FIG. 2, oxidizing section 24 may include gas outlet 40 with which to release exhaust gases from the oxidation process. Although, gas outlet 40 is shown arranged beneath platen 30, oxidation chamber 20 may be adapted to have the gas outlet along any portion of the periphery of oxidizing section 24. Moreover, oxidation chamber 20 may, in some cases, include more than one gas outlet along the periphery of oxidizing section 24. In addition, oxidation chamber 20 may include platen 30 upon which semiconductor topography 32 may be placed. In some cases, platen 30 may be adapted to move such that the distance between semiconductor topography 32 and partition 26 may be adjustable, depending on the design specifications of the oxidized layer and the process parameters of the oxidation process. Alternatively, platen 30 may be a fixed platform. In either case, platen 30 may be additionally or alternatively adapted to heat and/or cool the topography during the oxidation process. In other embodiments, however, platen 30 may not be adapted to regulate the temperature of semiconductor topography 32 during the oxidation process. In such an embodiment, the oxidation process may be specifically adapted to be conducted at room temperature. The temperature ranges that may be used for the oxidation process are discussed in more detail below with reference to the discussion of the rate of oxidation of the process described herein.

In general, a plasma may refer to a state in which a gas is ionized to have a plurality of ions, electrons, and radicals. As such, an oxygen plasma may include a state in which oxygen ions and radicals exist within a gas. Since oxygen ions and radicals are generally more reactive with layers of a semiconductor topography than the gas from which they originated, an oxygen plasma may oxidize a layer faster than a natural oxidation process in which a layer is exposed to a source of oxygen gas which is not in the form of a plasma. In some plasma oxidation processes, a layer may be oxidized primarily by the diffusion of ions rather than by the diffusion of radicals since ions typically are more energetic than radicals. In particular, an oxidation process which generates a plasma and exposes a semiconductor topography to the plasma within the same compartment of a reaction chamber may dispense a substantially higher number of ions into a layer as compared to the number of radicals dispensed into the layer.

Unfortunately, the diffusion of high energy ions within a layer may cause the atomic structure of the layer to be undesirably rearranged in some embodiments, changing the electrical and structural properties of the layer. The diffusion of radicals into a layer, however, may cause considerably less or no damage to a layer. As such, in some embodiments, it may be beneficial to employ an oxidation process which primarily introduces radicals rather than ions into a layer.

Such a process is described in reference to oxidation chamber 20 in FIG. 2, in which a plasma is generated in a separate compartment of the chamber than the compartment in which a layer is oxidized. More specifically, the oxidation process of oxidation chamber 20 may include extracting oxygen radicals from plasma generation section 22 through openings 25 within partition 26 to oxidizing section 24. In this manner, plasma generation section 22 and oxidizing section 24 may be connected through openings 22. In a preferred embodiment, partition 26 is grounded such that ions of the plasma generated within section 22 are not permitted to pass through partition 26 while radicals of the plasma are allowed to pass through openings 25. Consequently, oxidation chamber 20 may generate an atmosphere within oxidizing section 24 which is substantially absent of oxygen ions. In this manner, an oxidized film may be formed primarily from the diffusion of oxygen radicals with semiconductor topography 32 rather than from the diffusion with oxygen ions with semiconductor topography 32.

As noted above, plasma generation section 22 may be adapted to generate a plasma from which a layer may be oxidized in oxidizing section 24. In particular, plasma generation section 22 may be coupled to a plasma energy source such as a radio frequency power source or a microwave power source. In either case, power lead-in bar 38 may be used to couple such an energy source to electrode 28. Alternatively, the plasma energy source may be inductively coupled to plasma generation section 22. In any case, plasma generation section 22 may include one or more gas inlets adapted to introduce gas into the respective section of the chamber. For example, plasma generation section 22 may include first gas inlet 34 and second gas inlet 36. In some embodiments, gas inlet 34 may be used for the introduction of a gas comprising oxygen, such as diatomic oxygen gas ($O_2$), triatomic oxygen gas ($O_3$), or any gas which may be formed into a plasma of oxygen ions and radicals. In contrast, gas inlet 36 may be used for the introduction of a gas comprising a component which is adapted to enhance the generation of oxygen radicals from the oxygen containing gas. For example, gas inlet 36 may be used for the introduction of a gas comprising nitrogen. More specifically, gas inlet 36 may be used for the introduction of diatomic nitrogen gas or ammonia. Alternatively, gas inlet 36 may be used for the introduction of a gas including nitrogen and oxygen, such as nitrous oxide, for example. In this manner, the gas adapted to enhance the generation of oxygen radicals from the oxygen containing gas may be adapted to contribute additional oxygen radicals to the plasma in some embodiments. In yet other embodiments, gas inlet 36 may be used for the introduction of a gas comprising a component other than nitrogen.

It is noted that the aforementioned designation of gas inlets 34 and 36 may be reversed. In particular, the distinction of gas inlet 34 being used for the introduction of a gas comprising oxygen and gas inlet 36 being used for the introduction of a gas comprising a component adapted to enhance the generation of oxygen radicals from the oxygen containing gas may be switched. In yet other cases, plasma generation section 22 may include a single gas inlet with which to introduce the gas comprising oxygen and the gas which is adapted to enhance the generation of oxygen radicals within the plasma. In some embodiments, the gases may be mixed prior to being introduced into plasma generation section 22. In yet other embodiments, a gas which includes oxygen and a component which is adapted to enhance the generation of oxygen radicals may be introduced through a single gas inlet of plasma generation section 22. For example, in some embodiments, nitrous oxide may be introduced through a single gas inlet of plasma generation section 22. In yet other embodiments, the single gas inlet may be used to introduce the different gases in alternating intervals.

In some embodiments, the plasma generated in section 22 may be formed from a mixture of more than two gases. For example, a plurality of gases which are adapted to enhance the generation of oxygen radicals within the plasma may be used in some embodiments. In yet other embodiments, inert gases may be used to dilute the reactionary gases introduced into plasma generation section 22. In either case, plasma generation section 22 may include more than two gas inlets in some embodiments. As such, although only two gas inlets are shown in oxidation chamber 20, the method described herein is not limited to a process including such a reaction chamber. In particular, any number of gas inlets may be provided along plasma generation section 22. In any case, the gases may be introduced continuously into gas inlets 34 and/or 36. In yet other embodiments, the gases may be introduced in time intervals into gas inlets 34 and/or 36. In particular, residual amounts of the gases may linger within oxidation chamber 20, allowing a plasma to be generated without the continuous flow of gases into plasma generation section 22.

In some cases, gases which are used to create a plasma within plasma generation section 22 may be introduced into oxidizing section 24. For example, the gas which is adapted to enhance the generation of oxygen radicals within the plasma may be introduced into oxidizing section 24 in some embodiments. Such an introduction of one or more gases into oxidizing section 24 may be in addition to or alternative to the introduction of the one or more gases in plasma generation section 22. It is theorized that some of the gas introduced into oxidizing section 24 may transfer back to plasma generation section 22, allowing such a gas to be introduced into the plasma. Consequently, oxidation chamber 20 may be modified to include a gas inlet feeding into oxidizing section 24 for such an application. In yet other embodiments, oxidation chamber 20 may be absent of a gas inlet along oxidizing section 24 as shown in FIG. 2. In addition or alternatively, oxidation chamber 20 may be adapted to prevent the backflow of the gas within oxidizing section 24 into plasma generation section 22. In particular, oxidation chamber 20 may be adapted within a sufficient vacuum such that the gas within oxidizing section primarily flows in the direction toward gas outlet 40.

In some embodiments, the component adapted to enhance the generation of oxygen radicals within plasma generation section 22 may be used to increase the rate of oxidation within oxidizing section 24 as compared to a process which forms a plasma without gases comprising such a component. More specifically, the method described herein may oxidize a given thickness of a layer in a smaller amount of time than a process which does not form a plasma from a gas comprising a component adapted to enhance the generation of oxygen radicals. In general, the rate of oxidation of a process may depend on the material to be oxidized and the temperature at which the oxidation process is conducted. As such, the duration of the oxidation process described herein may vary depending on the temperature of the oxidation process, the material to be oxidized, and the desired thickness of the oxidized portion. In general, however, the duration of the oxidation process described herein may be between approximately 5 seconds and approximately 1 hour. In some cases, such processing durations may be optimized such that the oxidation process reliably produces thicknesses within a given specification, while minimizing the process time of the fabrication process. For example, in some cases, the duration of the oxidation process may be between approximately 20 seconds and approximately 20 minutes, or more specifically, between approximately 60 seconds and 120 seconds.

As stated above, the rate of oxidation may depend on the temperature at which the oxidation process is conducted. More specifically, the rate of oxidation of a process may depend on the temperature of the semiconductor topography to be oxidized. In general, the rate of oxidation typically increases with temperature of the semiconductor topography. As such, in some embodiments, it may be advantageous to heat the topography prior to or during the oxidation process. For example, in some embodiments, it may be advantageous to heat a semiconductor topography to a temperature greater than approximately 400° C. in order to maximize the rate of oxidation within the process. In other embodiments, however, subjecting a semiconductor topography to such high temperatures may adversely affect the properties of the layers arranged therein. For example, a device having magnetic layers may be affected by a processing temperature greater than approximately 400° C. or, more specifically, greater than approximately 300° C., in some cases. In particular, a relatively high temperature may alter the magnetic direction or the strength of magnetization within magnetic layers of a device. In some embodiments, such a high processing temperature may cause individual magnetic layers within a structure to interdiffuse, causing the properties of the magnetic layers to change.

As such, in some embodiments, the oxidation process described herein may be conducted with the semiconductor topography at a temperature that is less than approximately 300° C. In some cases, it may be advantageous to keep the semiconductor topography at a temperature that is less than approximately 200° C. during the oxidation process. In fact, in some embodiments, the oxidation process may be conducted at room temperature, or more specifically, at a temperature between approximately 15° C. and approximately 30° C. In any case, the temperature of a semiconductor topography may be controlled by heating or cooling applications incorporated within a platen upon which the semiconductor topography resides. In other embodiments, however, the platen may not include applications with which to heat or cool the semiconductor topography. Such a configuration may be particularly used for oxidation processes which are conducted at room temperature, for example.

Figure 3:
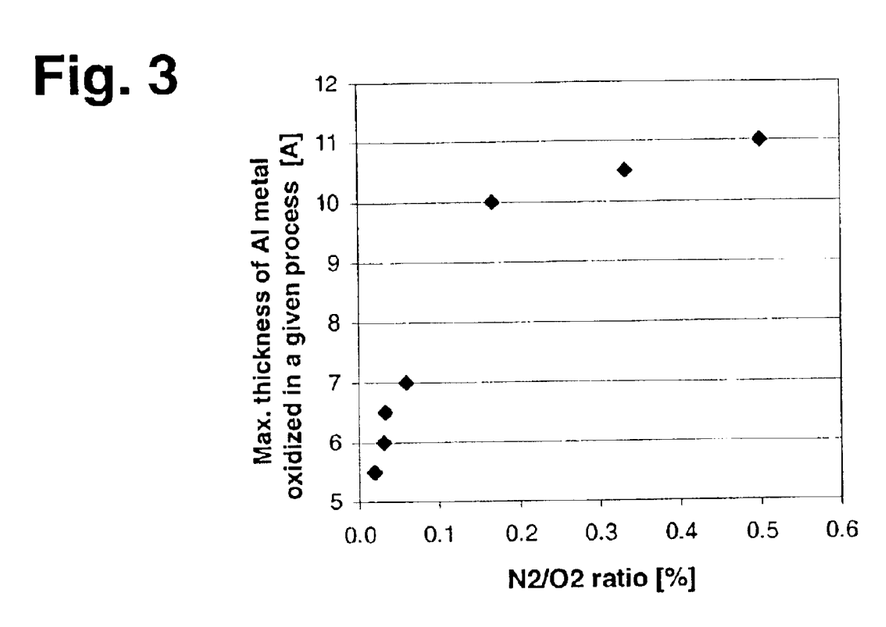
FIG. 3 depicts an exemplary plot of the maximum thickness of an aluminum layer oxidized using the method depicted in FIG. 1 versus nitrogen and oxygen ratios of a gas used to oxidize the layer.

In any case, the component adapted to enhance the generation of oxygen radicals within plasma generation section 22 may be further used to increase the depth of oxidation within oxidizing section 24 as compared to a process which forms a plasma without gases comprising such a component. More specifically, the component adapted to enhance the generation of oxygen radicals may be used to oxidize more metal within a given amount of time than a process which does not form a plasma from a gas including such a component. As such, the ratio of such a component to oxygen within the plasma may affect the thickness of the layer that is oxidized during the oxidation process. An exemplary plot of the thickness of a metal layer oxidized using the method described herein versus ratios of nitrogen to oxygen within the plasma used to oxidize the metal layer is depicted in FIG. 3. In particular, FIG. 3 illustrates the maximum thickness of aluminum metal which may be oxidized within 90 seconds by the method described herein versus particular ratios of nitrogen to oxygen within a plasma.

In general, an oxidation process may be measured by the thickness of the original portion of the layer which is oxidized by the process. As such, the y-axis of the plot depicted in FIG. 3 represents the thickness of the portion of the original metal layer which is oxidized by the process rather than the resulting thickness of the oxidized layer. It is noted that the plot of FIG. 3 is used to show that increasing the concentration of the component adapted to enhance the generation of oxygen radicals relative to the concentration of oxygen within a plasma may increase the thickness that a layer may be oxidized during an oxidation process. The plot of FIG. 3, however, merely illustrates results of an exemplary process in which nitrogen is used to oxidize an aluminum layer. As noted above, the method described herein may be used to form an oxidized layer comprising any metal or silicon. In addition, the method described herein may include any component which is known to enhance the generation of oxygen radicals within a plasma. As such, the embodiment discussed in reference to FIG. 3 does not restrict the gases which may be used to form an oxidized layer using the method described herein, nor the material composition of such an oxidized layer. Moreover, the ratios of the component adapted to enhance the generation of oxygen radicals to oxygen within a plasma as recited below may be applied to any component used for the oxidation process described herein and any layer to be oxidized.

Furthermore, the thickness of a layer oxidized during a process may generally depend on the duration of the process. More specifically, a greater amount of a layer is generally oxidized as the duration of an oxidation process is increased. Consequently, the plot of layer thicknesses versus nitrogen to oxygen ratios depicted in FIG. 3 may be differ depending on the duration of the oxidation process. For example, a plasma comprising a nitrogen to oxygen ratio of approximately 0.0006 may oxidize a thickness between approximately 5 angstroms and approximately 9 angstroms of an aluminum layer. Likewise, a plasma comprising a nitrogen to oxygen ratio of approximately 0.002 may oxidize a thickness between approximately 8 angstroms and approximately 12 angstroms of an aluminum layer. As such, the plotted curve of FIG. 3 may be shifted up or down relative to the duration of the oxidizing process.

As shown in FIG. 3, plasmas having nitrogen to oxygen ratios greater than approximately 0.0003 may be sufficient for oxidizing greater than approximately 6 angstroms of an aluminum layer using the method described herein for approximately 90 seconds. Accordingly, FIG. 3 shows that plasmas having nitrogen to oxygen ratios less than approximately 0.0003 may be used to oxidize thicknesses of an aluminum layer that are less than approximately 6 angstroms in some embodiments. In particular, through the extrapolation of the data, FIG. 3 indicates that a plasma substantially absent of nitrogen in an embodiment in which the oxidation process is conducted for approximately 90 seconds, may only oxidize approximately 5 angstroms of an aluminum layer. As stated above, however, in some embodiments, a metal oxide layer greater than approximately 6 angstroms is needed in order to provide a dielectric layer having sufficient insulating, barrier, and/or tunneling properties. For example, the thickness of a tunneling layer within a MTJ may need to be greater than approximately 8 angstroms, in some embodiments, in order to provide sufficient tunneling properties for a particular RA product. In the embodiment of in FIG. 3, the method for fabricating an aluminum oxide tunneling layer with such a thickness may require a nitrogen to oxygen ratio greater than approximately 0.0008. In general, the tunneling resistance of a magnetic tunnel junction (MTJ) is generally exponentially dependent on the thickness of the tunneling layer of the MTJ. More specifically, the tunneling resistance of the MTJ is directly proportional to the resistance-area (RA) product of a MTJ which is in turn exponentially dependent upon the thickness of the tunneling layer.

However, the method described herein is not limited to oxidizing portions of layers of a particular thickness. In particular, the method described herein is not restricted to applications in which portions of layers with thicknesses greater than approximately 6 angstroms are oxidized. For example, the method described herein may employ a plasma with a ratio of nitrogen to oxygen that is between approximately 0.00002 and approximately 0.30. Larger or smaller ratios of nitrogen to oxygen may be used, however, depending on the design specifications of the device. For example, in some embodiments, the ratio of nitrogen to oxygen may be controlled such that nitrogen is not introduced into the oxidized layer. For instance, in the embodiment of FIG. 3, the nitrogen to oxygen ratio of the plasma may be low enough such that aluminum nitride or aluminum oxynitride are not formed. Such a measure to prevent the introduction of nitrogen into the oxidized layer may be particularly advantageous in applications for forming tunneling layers of MTJs. In particular, the formation of aluminum nitride or aluminum oxynitride for a tunneling layer of a MTJ may undesirably hinder the tunneling properties of the MTJ. In addition or alternatively, the formation of nitride within an oxidized layer of a MTJ may cause solubility and/or corrosion problems within the device. As such, in some embodiments, the ratio of nitrogen to oxygen within a plasma may be between approximately 0.0005 and approximately 0.10 or more preferably, between approximately 0.001 and approximately 0.005.

Furthermore and as noted above, in some embodiments, oxidizing a particular thickness of a layer may be advantageous in some applications. For example, in some embodiments, the thickness of a metal layer oxidized to form a tunneling of a MTJ may need to be greater than approximately 8 angstroms or, more preferably, between approximately 8 angstroms and approximately 11 angstroms. Consequently, the nitrogen to oxygen ratio range for the formation of a tunneling layer of a MTJ may be between approximately 0.0008 and approximately 0.005 or more specifically between approximately 0.0015 and approximately 0.002. In yet other embodiments, it may be advantageous to use the method described herein to overcome the undesirable characteristics of conventional oxidation processes. In particular, it may be advantageous to oxidize a portion of a layer having a thickness greater than approximately 6 angstroms in order to avoid the passivation limitations of a natural oxidation process and the damaging characteristics of a single chamber plasma oxidation process. Accordingly, the nitrogen to oxygen ratio for oxidizing a portion of layer having a thickness greater than approximately 6 angstroms may be greater than approximately 0.0003 as stated above.

In addition to the ability to oxidize portions of layers having thicknesses greater than approximately 6 angstroms, the method described herein may advantageously form an oxidized layer having a uniform oxygen distribution. Consequently, the properties of the oxidized layer may be homogeneous. In particular, a dielectric layer having homogenous insulating, barrier, and/or tunneling properties may be fabricated. In addition, the depth of the oxidation process described herein may be controlled such that underlying layers may not be oxidized. Such an adaptation may be particularly advantageous in the fabrication of MTJ devices. In particular, such a method may be used to form a metal oxide tunneling layer without oxidizing underlying magnetic layers of the junction. In addition, the method may be used within a MRAM fabrication process to oxidize portions of magnetic layers such that at least a partial periphery of a MTJ may be outlined.

Furthermore, the method described herein may be conducted at a temperature less than approximately 300° C., or more specifically at room temperature. Consequently, in a case in which the layer to be oxidized is contained within a semiconductor topography comprising magnetic materials, the process of oxidation may be conducted without undesirably affecting the properties of the magnetic materials. Moreover, the method described herein may oxidize a layer faster than processes which do not include extracting oxygen radicals from a plasma generated with a component adapted to enhance the generation of such radicals. Furthermore, the method described herein may oxidize a layer without damaging the layer, or more specifically, without undesirably rearranging the layer's atomic structure beyond what may be obtained through natural oxidation of such a layer. Moreover, a MTJ fabricated with the method described herein may have similar tunneling magnetoresistance ratios to those of conventional MTJs. For example, the method may be used for fabricating a MTJ having a tunneling magnetoresistance ratio of at least approximately 30% for applications in which approximately 300 mV is applied for the read operation of the junction.

It will be appreciated to those skilled in the art having the benefit of this disclosure that this invention is believed to provide a method for oxidizing a layer. Further modifications and alternative embodiments of various aspects of the invention will be apparent to those skilled in the art in view of this description. For example, although the method is particularly described in reference to the fabrication of a tunneling layer of a MTJ, the method may be used for the oxidation of a layer in any application. In addition, although the method is particularly described in reference to the oxidation of aluminum, the method may be used for the oxidation of any metal. For example, such a process may be used for the oxidation of copper, titanium, tungsten, or any magnetic material. Moreover, the method may be used for the oxidation of a material comprising silicon as well. In addition, although the method is described in reference to oxidizing a single layer, the method may be used for oxidizing a plurality of layers within a topography. Furthermore, other processing steps generally used to fabricate semiconductor devices may be included with the method described herein. For example, an oxidized topography fabricated using the method described herein may be subsequently annealed, in some embodiments. Such an annealing process may be used to rearrange the oxygen atoms within the topography and/or to better distinguish an interface between an oxidized portion and adjacent layers of the topography. It is intended that the following claims be interpreted to embrace all such modifications and changes and, accordingly, the specification and drawings are to be regarded in an illustrative rather than a restrictive sense.

What is claimed is:

1. A method for forming a metal oxide layer, comprising:
   generating a plasma from a first gas comprising oxygen and a second gas adapted to enhance the generation of oxygen radicals from the first gas;
   extracting the oxygen radicals from the plasma; and
   diffusing the extracted oxygen radicals into a metal layer.

2. The method of claim 1, wherein the second gas comprises nitrogen.

3. The method of claim 2, wherein the second gas comprises diatomic nitrogen gas.

4. The method of claim 2, wherein the second gas comprises ammonia.

5. The method of claim 2, wherein the second gas is further adapted to contribute additional oxygen radicals to the plasma.

6. The method of claim 5, wherein the second gas comprises nitrous oxide.

7. The method of claim 1, wherein the method is adapted to prevent the oxidation of layers underlying the metal layer.

8. A method for processing a semiconductor topography, comprising:

generating a plasma from a first gas comprising oxygen and a second gas comprising nitrogen; and oxidizing a layer of the semiconductor topography with the plasma to form an oxidized layer substantially absent of nitrogen.

9. The method of claim 8, wherein the plasma comprises a nitrogen to oxygen ratio between approximately 0.00002 and approximately 0.3.

10. The method of claim 9, wherein the oxidized layer comprises a tunneling layer of a magnetic tunnel junction.

11. The method of claim 8, wherein the step of oxidizing comprises oxidizing a portion of the layer having a thickness greater than approximately 6 angstroms.

12. The method of claim 8, wherein the layer comprises a metal.

13. The method of claim 12, wherein the metal comprises aluminum.

14. The method of claim 12, wherein the metal comprises nickel-iron.

15. A method for forming a metal oxide layer comprising oxidizing a metal layer within a remote plasma reaction chamber at a temperature of less than approximately 300° C., wherein the step of oxidizing comprises:

generating a plasma from a first gas comprising oxygen and a second gas comprising nitrogen, wherein the second gas is adapted to enhance the generation of oxygen radicals from the first gas, and wherein the ratio of the first gas to the second gas is adapted to prevent the introduction of nitrogen within the metal oxide layer;

extracting the oxygen radicals from the plasma;

diffusing the extracted oxygen radicals with the metal layer; and oxidizing a portion of the metal layer having a thickness greater than approximately 6 angstroms.

16. The method of claim 15, wherein the step of oxidizing comprises oxidizing a portion of the metal layer comprising a thickness between approximately 8 angstroms and approximately 11 angstroms.

17. The method of claim 15, wherein the method is adapted to prevent the oxidation of layers underlying the metal layer.

18. The method of claim 15, wherein the step of oxidizing comprises oxidizing at a temperature less than approximately 200° C.

* * * * *

UNITED STATES PATENT AND TRADEMARK OFFICE
CERTIFICATE OF CORRECTION

PATENT NO. : 6,893,978 B1
DATED : May 17, 2005
INVENTOR(S) : Kula, Witold It is certified that error appears in the above-identified patent and that said Letters Patent is hereby corrected as shown below:

<u>Title page,</u>
Item [74], *Attorney, Agent, or Firm*, delete "Kevin I. Daffer" and substitute -- Kevin L. Daffer --; and delete "Mollie F. Lettang" and substitute -- Mollie E. Lettang --.

Signed and Sealed this

Third Day of January, 2006

JON W. DUDAS
*Director of the United States Patent and Trademark Office*